United States Patent
Hauschild et al.

(10) Patent No.: US 8,081,386 B2
(45) Date of Patent: Dec. 20, 2011

(54) DEVICE FOR ILLUMINATING AN AREA AND DEVICE FOR APPLYING LIGHT TO A WORK AREA

(75) Inventors: Dirk Hauschild, Köln (DE); Manfred Jarczynski, Recklinghausen (DE); Thomas Mitra, Düsseldorf (DE)

(73) Assignee: LIMO Patentverwaltung GmbH & Co. KG, Gerstengrund (DE)

(*) Notice: Subject to any disclaimer, the term of this patent is extended or adjusted under 35 U.S.C. 154(b) by 163 days.

(21) Appl. No.: 12/340,906

(22) Filed: Dec. 22, 2008

(65) Prior Publication Data

US 2009/0161224 A1    Jun. 25, 2009

(30) Foreign Application Priority Data

Dec. 22, 2007 (DE) .......... 10 2007 062 564
Mar. 1, 2008 (DE) .......... 10 2008 012 047

(51) Int. Cl.
*G02B 27/10* (2006.01)

(52) U.S. Cl. ........ 359/618; 359/619; 359/621; 359/624; 359/626; 359/455; 362/231; 362/244; 362/268

(58) Field of Classification Search .......... 359/618–626; 362/97.1, 97.2, 231, 234, 244, 268, 287, 362/293, 296.1, 317; 345/214; 250/307, 250/311, 396 R, 398, 492.23; 355/53, 67, 355/70
See application file for complete search history.

(56) References Cited

U.S. PATENT DOCUMENTS

| | | | |
|---|---|---|---|
| 5,581,408 A | | 12/1996 | Schmutz et al. |
| 5,745,153 A | | 4/1998 | Kessler et al. |
| 5,973,844 A | * | 10/1999 | Burger .......... 359/622 |
| 6,124,974 A | * | 9/2000 | Burger .......... 359/621 |
| 6,381,072 B1 | * | 4/2002 | Burger .......... 359/622 |
| 6,707,612 B2 | * | 3/2004 | Ohtsu et al. .......... 359/620 |
| 6,867,847 B2 | * | 3/2005 | Kluter .......... 355/67 |
| 7,116,404 B2 | * | 10/2006 | Lof et al. .......... 355/67 |
| 7,139,064 B2 | | 11/2006 | Nam et al. |
| 7,158,307 B2 | | 1/2007 | Coston et al. |
| 7,251,020 B2 | * | 7/2007 | Gui .......... 355/67 |
| 7,378,668 B2 | * | 5/2008 | Tanimoto et al. .......... 250/396 R |
| 7,532,225 B2 | * | 5/2009 | Fukushima et al. .......... 345/696 |
| 2006/0119947 A1 | | 6/2006 | Coston et al. |
| 2009/0021715 A1 | | 1/2009 | Deguenther et al. |

FOREIGN PATENT DOCUMENTS

DE   19534165 A1   5/1996
WO   2007093433 A1   8/2007

OTHER PUBLICATIONS

German Search Report Deutsches Patent-un Markenamt dated Aug. 21, 2008.
European Search Report dated Jan. 1, 2011.

* cited by examiner

*Primary Examiner* — Loha Ben
(74) *Attorney, Agent, or Firm* — Norris McLaughlin & Marcus P.A.

(57) ABSTRACT

Device for illuminating an area, in particular for illuminating a mask (14), for example for a lithographic application, with at least one light source (1) for producing light (3) that can be used for the illumination, optics means (2) for shaping the light (3) produced by the at least one light source (1), and separation means (4, 4', 4") capable of dividing the light (3) to be used for the illumination into several mutually separated partial beams (5), so that these partial beams (5) can illuminate the area to be illuminated with a spacing therebetween. The present invention also relates to a device for applying light to a work area.

27 Claims, 4 Drawing Sheets

DEVICE FOR ILLUMINATING AN AREA AND DEVICE FOR APPLYING LIGHT TO A WORK AREA

BACKGROUND OF THE INVENTION (1) Field of the Invention

The present invention relates to a device for illuminating an area, in particular for illuminating a mask, for example for a lithographic application, with at least one light source for producing light to be used for the illumination, and optic means for shaping the light produced by the at least one light source. The invention also relates to a device for applying light to a work area.

(2) Description of Related Art

Such devices are used, for example, in lithographic applications for illuminating a mask. The light of a light source, typically implemented as a laser, is shaped, in particular homogenized and collimated, by suitable optic means and impinges according to the state-of-the-art on a large area of the mask. The mask typically has a plurality of small openings or transparent sections, through which frequently only a small portion of the light can pass and be used for the lithographic application. A large fraction of the light is absorbed by the opaque regions located between the openings or the transparent sections of the mask. Disadvantageously, applications employing such devices, such as laser ablation, require a much higher output power of the light source than would actually be necessary. On the other hand, a large fraction of the light energy is absorbed by the mask, which therefore may in certain situations require complex cooling.

BRIEF SUMMARY OF THE INVENTION

The object of the present invention is to provide a device of the aforedescribed type for illuminating an area and/or a device for applying light to a work area, which can employ light sources with lower power.

This is attained with the invention with respect to the device for illuminating an area by a device of the aforedescribed type for illuminating an area including: at least one light source for producing light that can be used for the illumination; optics means for shaping the light produced by the at least one light source; and separation means for dividing the light to be used for the illumination into several mutually separated partial beams that illuminate the area to be illuminated with a spacing therebetween. The invention is also directed to a device for applying light to a work area such as a mask.

The device includes separation means capable of dividing the light to be used for the illumination into several mutually separated partial beams, so that these partial beams can illuminate the area to be illuminated with a spacing therebetween. With this approach, the openings or transparent sections of the mask can be purposely illuminated, whereas the opaque regions of the mask arranged in between remain mostly un-illuminated. In this way, the mask absorbs less light and need not be cooled, and the intensity of the light source can also be reduced.

In one embodiment, the separation means may include at least one first array of first lenses capable of dividing the light into separate partial beams at least with respect to a first direction, wherein the first lenses preferably all have the same focal length.

Alternatively, at least one of the first lenses may have a focal length that is different from the focal lengths of the other first lenses. In this way, an image can be realized in different planes.

Instead of a first array with first lenses, several first arrays each having first lenses may be arranged consecutively in the propagation direction of the light. For example, imaging errors can be corrected by consecutively arranging two or more first lenses of two or more first arrays.

In addition, the separation means may include at least one second array of second lenses which is arranged in the propagation direction of the light between the at least one first array and the area to be illuminated, wherein the second lenses preferably all have the same focal length.

Alternatively, at least one of the second lenses may have a focal length that is different from the focal lengths of the other second lenses. In this way, an image can be realized in different planes.

Instead of a second array with second lenses, several second arrays each having second lenses may be arranged consecutively in the propagation direction of the light.

In particular, the distance between the at least one first array and the at least one second array in the propagation direction of the light may correspond to the sum of the focal length of the first lenses and the focal length of the second lenses. This produces a telescopic arrangement, wherein the size of the partial beams at least with respect to the first direction can be affected by the ratio of the focal lengths of the first and the second lenses. The first lenses and the second lenses may also have a positive refractive power or focal length, resulting in a Kepler telescope. Alternatively, the refractive power or focal lengths of the first or of the second lenses may be negative, resulting in a Galilean telescope where the distance between the first and the second array is correspondingly shorter.

All apertures of the first lenses may be identical.

Alternatively, at least one of the apertures of the first lenses may be different from the other apertures of the first lenses.

All apertures of the second lenses may be identical.

By having apertures of different sizes, some of the partial beams may be larger than other partial beams at least in the first direction. In this way, for example, a mask with different-size openings or transparent sections can be effectively illuminated.

In one embodiment, the separation means may include at least one third array of third lenses capable of dividing the light into separate partial beams at least with respect to a second direction that is perpendicular to the first direction, wherein the third lenses preferably all have the same focal length.

Alternatively, at least one of the third lenses may have a focal length that is different from the focal lengths of the other third lenses. In this way, an image can be realized in different planes.

Instead of a third array with third lenses, several third arrays having each third lenses may be arranged consecutively in the propagation direction of the light.

The third array may be arranged between the first array and the second array.

Moreover, the separation means may include at least one fourth array of fourth lenses which is arranged in the propagation direction of the light between the at least one third array and the at least one second array and the area to be illuminated, wherein the fourth lenses preferably all have the same focal length.

Alternatively, at least one of the fourth lenses may have a focal length that is different from the focal lengths of the other fourth lenses. In this way, an image can be realized in different planes.

Instead of a fourth array with fourth lenses, several fourth arrays having each fourth lenses may be arranged consecutively in the propagation direction of the light.

In particular, the distance between the at least one third array and the at least one fourth array in the propagation direction of the light may correspond to the sum of the focal length of the third lenses and the focal length of the fourth lenses. This also results in a telescope arrangement, wherein the ratio of the focal lengths of the first and the second lenses may affect the size of the partial beams at least with respect to the second direction. The first lenses and the second lenses may have a positive refractive power or focal length, resulting in a Kepler telescope. Alternatively, the refractive power or focal lengths of the first or of the second lenses may be negative, resulting in a Galilean telescope where the distance between the first and the second array is correspondingly shorter.

Alternatively, at least one of the apertures of the third lenses may be different from the other apertures of the third lenses.

All apertures of the fourth lenses may be identical.

Alternatively, at least one of the apertures of the fourth lenses may be different from the other apertures of the fourth lenses.

By making also the apertures of the third and fourth lenses of different size, some of the partial beams at least in the second direction may be larger than other partial beams. In this way, for example, a mask with different-size openings or transparent sections can be effectively illuminated.

The first lenses and/or the second lenses and/or the third lenses and/or the fourth lenses may be formed as cylindrical lenses. The cylindrical lenses may have a spherical or an aspherical shape.

Alternatively, the lenses may have an essentially spherical or an aspherical circular-symmetric form. These lenses may cover, for example, a circular or hexagonal aperture.

When the lenses are implemented as cylindrical lenses, the cylinder axes of the first and the second lenses may extend in the second direction while the cylinder axes of the third and the fourth lenses may extend in the first direction.

In addition, the first lenses and/or the second lenses and/or the third lenses and/or the fourth lenses may be arranged symmetrical with respect to the average propagation direction of the light to be used for the illumination such that the first lenses and/or the second lenses and/or the third lenses and/or the fourth lenses do not alter the average propagation direction of the light.

Alternatively, the first lenses and/or the second lenses and/or the third lenses and/or the fourth lenses may be arranged asymmetrical with respect to the average propagation direction of the light such that the first lenses and/or the second lenses and/or the third lenses and/or the fourth lenses alter the average propagation direction of the light. In this way, all or several of the partial beams can be deflected, so that also irregularly distributed openings or transparent regions of the mask can be purposely illuminated.

Preferably, the optics means may include homogenization means capable of effecting a uniform distribution of the light in the plane of the first and/or the third array, and collimation means capable of collimating the light before the light impinges on the first and/or the third array.

BRIEF DESCRIPTION OF THE SEVERAL VIEWS OF THE DRAWINGS

Additional features and advantages of the present invention are described in the following specification of preferred exemplary embodiments with reference to the appended drawings.

To improve clarity, Cartesian coordinates systems are shown in the drawings.

FIG. 1b is a side view of the device of FIG. 1a;

FIG. 2b is a side view of the separation means and the mask of the device according to FIG. 2a;

FIG. 5a is a top view of separation means and a mask of a third embodiment of the device of the invention; and FIG. 5b is a side view of the separation means and the mask of the device of FIG. 5a.

BRIEF DESCRIPTION OF THE SEVERAL VIEWS OF THE DRAWING(S)

Figure 1A:
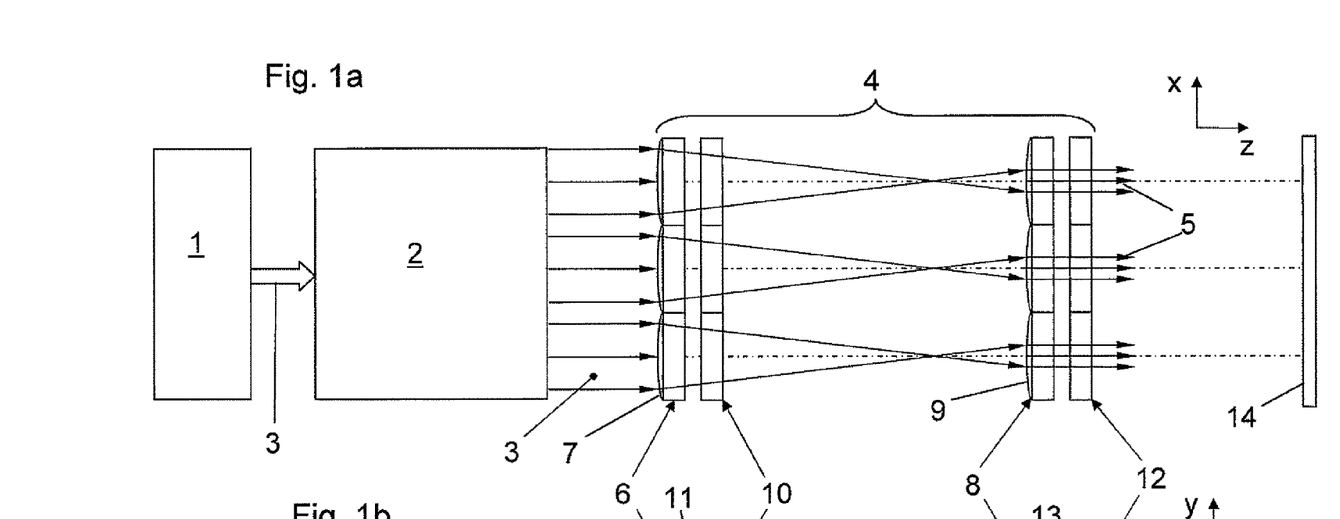
FIG. 1a is a top view of a first embodiment of a device according to the invention.
Figure 1B:
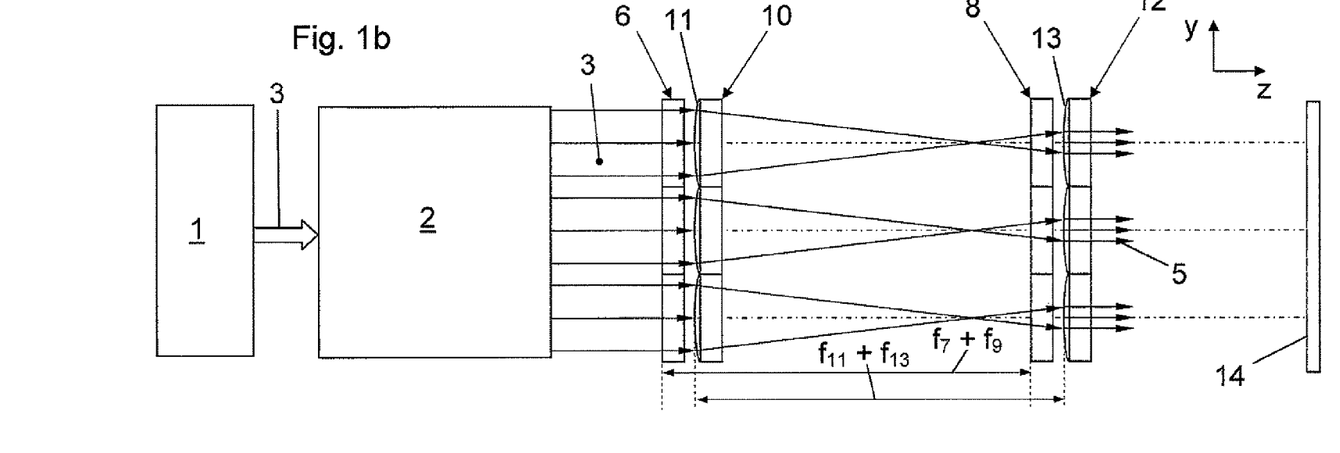

FIG. 1a and FIG. 1b illustrate schematically a light source 1 and optics means 2. The light source 1 may be a suitable laser, for example a laser diode bar or an excimer laser or a Nd:YAG laser. The optics means may include collimation means and homogenization means which are not shown in detail, in order to collimate and homogenize the light 3 emitted from the light source 1.

The device also includes separation means 4 capable of dividing the light 3 into individual, mutually separated partial beams 5.

The separation means include a first array 6 of first lenses 7 implemented as cylindrical lenses and a second array 8 of second lenses 9 implemented as cylindrical lenses, which both affect the light with respect to the X-direction (see FIG. 1a). The cylindrical axes of the first and second lenses 7, 9 are oriented in the Y-direction. Both the first array 6 and the second array 8 are each arranged on the entrance face of a separate substrate.

The apertures of all first lenses 7 are identical at least in the X-direction. The apertures of all second lenses 9 are also identical at least in the X-direction. In addition, all the first lenses 7 and all the second lenses 9 are oriented symmetrical to the average propagation direction Z of the light, so that the average propagation direction Z of the light 3 is not deflected when passing through the first and/or the second lenses 7, 9. In addition, each one of the first lenses 7 is arranged exactly opposite to a corresponding one of the second lenses 9 in the Z-direction, so that their optical axes coincide.

All first lenses 7 have the same focal length $f_7$. All second lenses 9 also have the same focal length $f_9$. The distance between the first array 6 and the second array 8 corresponds to the sum $f_7+f_9$ of the focal lengths $f_7$, $f_9$ of the first and the second lenses 7, 9 (see FIG. 1b). The first and the second array 6, 8 therefore form a telescope arrangement. The focal lengths $f_7$ of the first lenses 7 are greater, for example approximately 3 times greater, than the focal lengths $f_9$ of the second lenses 9. The homogeneous light 3 is then split by the telescope, which consists of the first array 6 and the second array 8, into mutually separate partial beams 5 with respect to the X-direction.

The separation means also include a third array 10 of third lenses 11 formed as cylindrical lenses and a fourth array 12 of lenses 13 formed as cylindrical lenses, which both affect the light with respect to the Y-direction (see FIG. 1b) The cylinder axes of the third and fourth lenses 11, 13 are here oriented in the X-direction. Both the third array 10 and the fourth array 12 are each arranged on the entrance face of a separate substrate.

The apertures of all third lenses 11 are identical at least in the Y-direction. In addition, the apertures of all fourth lenses 13 are identical at least in the Y-direction. In addition, all of the third lenses 11 and all of the fourth lenses 13 are oriented symmetrical to the average propagation direction Z of the light 3 so that the average propagation direction Z of the light 3 is not deflected when passing through the third and/or the fourth lenses 11, 13. In addition, each one of the third lenses 11 is arranged in the Z-direction exactly opposite to a corresponding one of the fourth lenses 13, so that their optical axes coincide.

All third lenses 11 have the same focal length $f_{11}$. In addition, all fourth lenses 13 have the same focal length $f_{13}$. The distance between the third array 10 and the fourth array 12 corresponds to the sum $f_{11}+f_{13}$ of the focal lengths $f_{11}$, $f_{13}$ of the third and the fourth lenses 11, 13 (see FIG. 1b). The third and the fourth array 10, 12 therefore also form a telescope arrangement. The focal lengths $f_{11}$ of the third lenses 11 are greater, for example approximately 3 times greater, than the focal lengths $f_{13}$ of the fourth lenses 13. The homogeneous light 3 is then split by the telescope, which consists of the third array 10 and the fourth array 12, into mutually separated partial beams 5 with respect to the Y-direction.

In addition, the focal lengths $f_7$ of the first lenses 7 may correspond to the focal lengths $f_{11}$ of the third lenses 11. In addition, the focal lengths $f_9$ of the second lenses 9 may correspond to the focal lengths $f_{13}$ of the fourth lenses 13.

Figure 3:
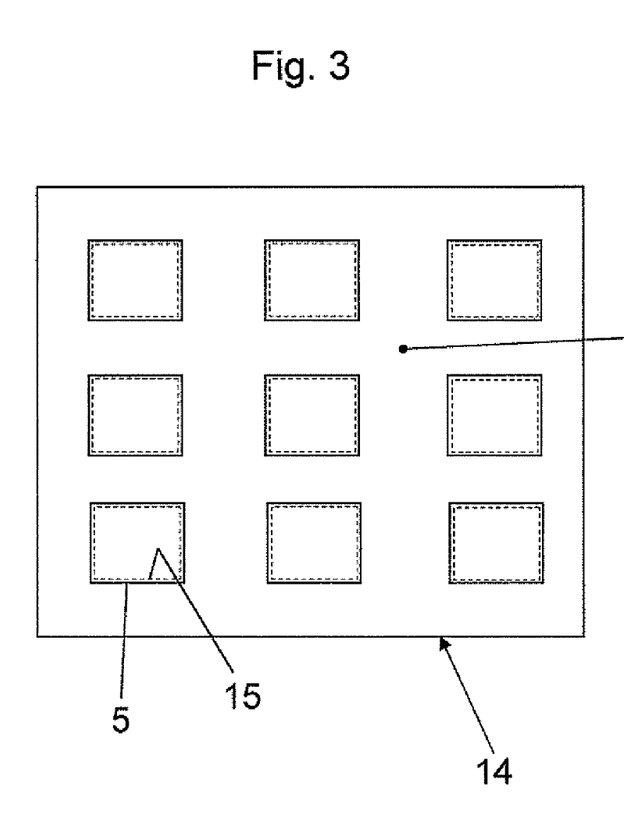
FIG. 3 is a schematic front view of a mask illuminated with a device according to the invention.

The arrays 6, 8, 10, 12 depicted in FIG. 1a and FIG. 1b only represent exemplary embodiments and may include a significantly greater number of lenses 7, 9, 11, 13. The partial beams 5 emitted from the separation means 4 impinge on a mask 14 which has a plurality of openings 15 or transparent regions for transmitting the light. As seen in FIG. 3, the partial beams 5 (shown in FIG. 3 as continuous lines) each impinge on at least one of the openings 15 of the mask 14 (shown in FIG. 3 as a dashed line) and have a cross-sectional area that is only insignificantly greater than the unobstructed width of the corresponding opening 15. In this way, each of the openings 15 is reliably and completely illuminated, while only a small fraction of the light is absorbed by the opaque regions 16 of the mask 14 disposed between the openings 15.

Figure 2A:
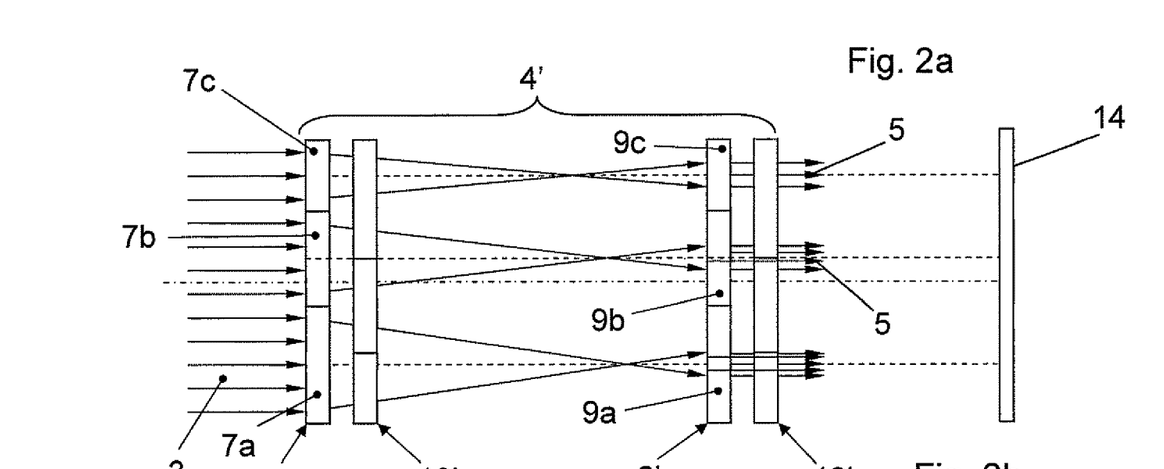
FIG. 2a is a top view of separation means and a mask of a second embodiment of the device of the invention.
Figure 2B:
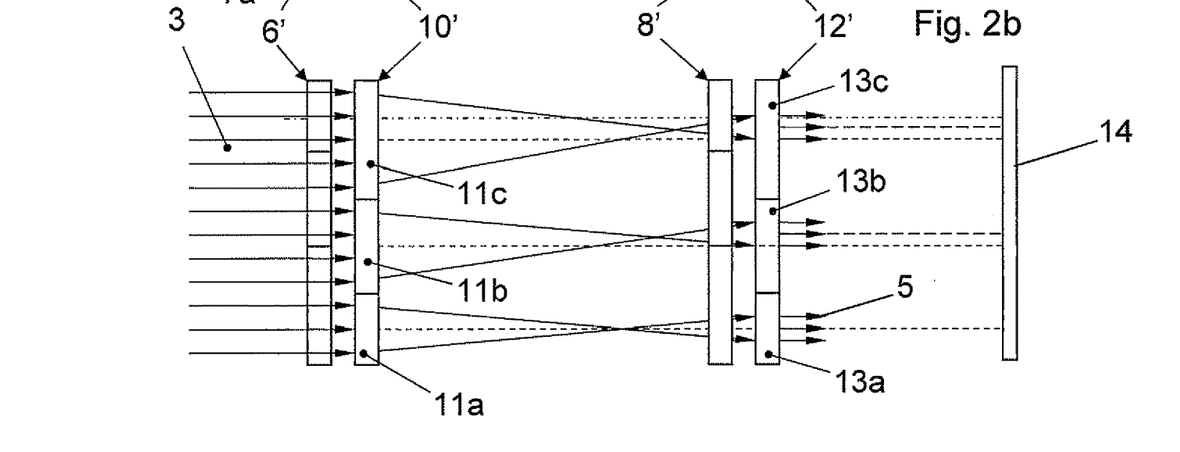

Identical elements in the embodiments illustrated in FIG. 2a and FIG. 2b have the same reference symbols as in FIG. 1a and FIG. 1b.

The embodiment depicted in FIG. 2a and FIG. 2b also includes separation means 4' having four arrays 6', 8', 10', 12' of lenses 7a, 7b, 7e; 9a, 9b, 9c; 11a, 11b, 11c; 13a, 13b, 13c. The lenses 7a, 7b, 7c; 9a, 9b, 9c; 11a, 11b, 11c; 13a, 13b, 13c are also implemented as cylindrical lenses and have an orientation corresponding to that of the device depicted in FIG. 1a and FIG. 1b. In addition, the focal lengths of the lenses 7a, 7b, 7c; 9a, 9b, 9c; 11a, 11b, 11c; 13a, 13b, 13c also correspond to the focal lengths of the lenses 7, 9, 11, 13 of the device of FIG. 1a and FIG. 1b.

However, the lenses 7a, 7b, 7c; 9a, 9b, 9c; 11a, 11b, 11c; 13a, 13b, 13c do not all have the same aperture. Instead, the apertures of the first lenses 7a, 7b, 7c are different from one another at least in the X-direction. Moreover, the apertures of the second lenses 9a, 9b, 9c are also different from one another at least in the Y-direction. The apertures of the third lenses 11a, 11b, 11c are also different from one another at least in the Y-direction. The apertures of the fourth lenses 13a, 13b, 13c are also different from one another at least in the X-direction. This results in cross-sections of different sizes and//or in different intensities of the partial beams 5 on the mask 14.

In addition, several or all lenses 7a, 7b, 7c; 9a, 9b, 9c; 11a, 11b, 11c; 13a, 13b, 13c of the separation means 4' include lens segments arranged off-axis. The lenses 7a, 7b, 7c; 9a, 9b, 9c; 11a, 11b, 11c; 13a, 13b, 13c of the separation means 4' are then not symmetric with respect to the average propagation direction Z of the light 3 and therefore deflect the light. This applies, for example, to the lenses 7b and 9b in FIG. 2a, and to the lenses 11b, 11c, 13b and 13c in FIG. 2b.

Figure 4:
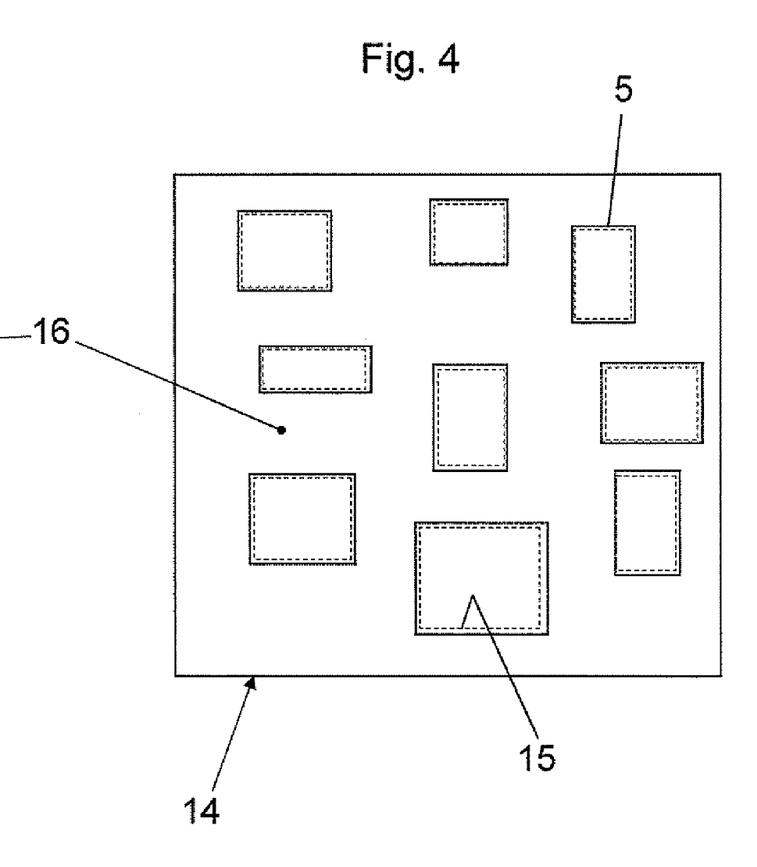
FIG. 4 is a schematic front view of another mask illuminated with a device according to the invention.

Due to the different apertures and the lens segments arranged off-axis, the separation means 4' can produce on the mask 14 any type of spot arrangements, in particular non-overlapping spot arrangements. This is indicated as an example in FIG. 4.

Figures 5A, 5B:
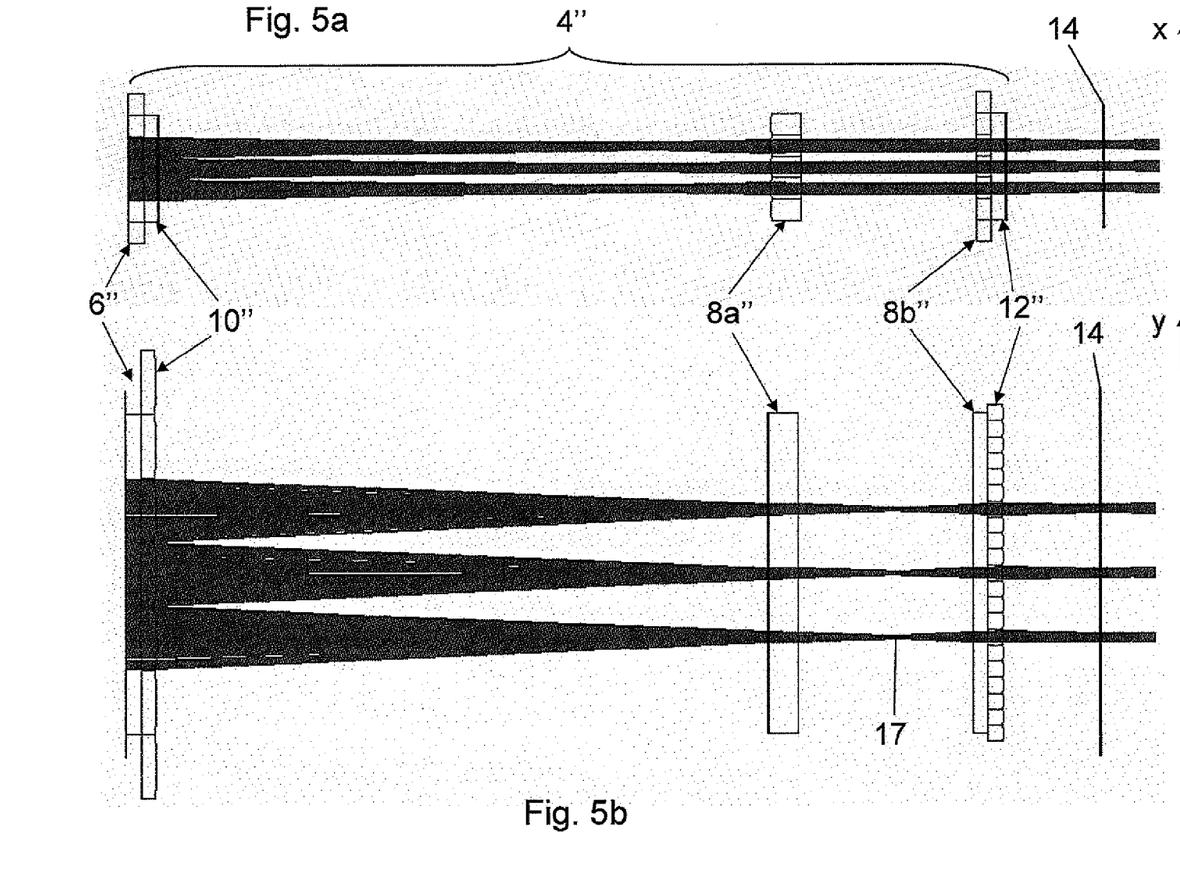

Identical elements or elements performing the same function in FIG. 5a and FIG. 5b have the same reference symbols as in FIG. 1a, FIG. 1b, FIG. 2a and FIG. 2b.

The embodiment of the separation means 4" illustrated in FIG. 5a and FIG. 5b is different from the embodiment of FIG. 1a and FIG. 1b in that the two first arrays 6" and 10" are combined on a single substrate. In addition, the third array is divided into two spaced-apart partial arrays 8a" and 8b". The second partial array 8b" is combined with the fourth array 12" on a single substrate.

By dividing the third array into two partial arrays 8a" and 8b", the focal range indicated with a reference symbol 17 is not located inside the third array, but instead between the two partial arrays 8a" and 8b".

The invention claimed is:

1. A device for illuminating an area, comprising:
   at least one light source (1) for producing light (3) for an illumination;
   optics means (2) for shaping the light (3) produced by the at least one light source (1);
   a mask (14) having a plurality of openings (15) or transparent regions for passing the light (3) in a direction towards the area, and opaque regions (16) disposed between the openings (15) or transparent regions; and
   separation means (4, 4', 4") for dividing the light (3) to be used for the illumination into several mutually separated partial beams (5), the separate partial beams illuminating the mask with a spacing therebetween.

2. The device according to claim 1, wherein the separation means comprise at least one first array (6, 6', 6") of first lenses (7; 7a, 7b, 7c) dividing the light (3) into the separate partial beams (5) at least with respect to a first direction (X), wherein the first lenses (7; 7a, 7b, 7c) each have apertures and all have the same focal length ($f_7$).

3. The device according to claim 2, wherein the separation means (4, 4', 4") further comprise at least one second array (8, 8', 8a", 8b") of second lenses (9; 9a, 9b, 9c) which is arranged in a propagation direction (Z) of the light (3) between the at least one first array (6, 6', 6") and the area to be illuminated, wherein the second lenses (9; 9a, 9b, 9c) each have apertures and all have the same focal length ($f_9$).

4. The device according to claim 3, wherein all apertures of the second lenses (9) are identical.

5. The device according to claim 2, wherein all apertures of the first lenses (7) are identical.

6. The device according to claim 2, wherein the separation means (4, 4') further comprise:
- at least one second array (8, 8', 8a", 8b") of second lenses (9; 9a, 9b, 9c) which is arranged in a propagation direction (Z) of the light (3) between the at least one first array (6, 6', 6") and the area to be illuminated, wherein the second lenses (9; 9a, 9b, 9c) each have apertures and all have the same focal length ($f_9$);
- at least one third array (10, 10', 10") of third lenses (11; 11a, 11b, 11c) dividing the light (3) into the separate partial beams (5) at least with respect to a second direction (Y) perpendicular to the first direction (X), wherein the third lenses (11; 11a, 11b, 11c) all have the same focal length ($f_{11}$);
- at least one fourth array (12, 12', 12") of fourth lenses (13; 13a, 13b, 13c) which is arranged in the propagation direction (Z) of the light (3) between the at least one third array (10, 10', 10") and the at least one second array (8, 8', 8a", 8b") and the area to be illuminated, wherein the fourth lenses (13; 13a, 13b, 13c) all have the same focal length ($f_{13}$); and
- wherein the first lenses (7; 7a, 7b, 7c) and/or the second lenses (9; 9a, 9b, 9c) and/or the third lenses (11; 11a, 11b, 11c) and/or the fourth lenses (13; 13a, 13b, 13c) are formed as cylindrical lenses.

7. The device according to claim 2, wherein the separation means (4, 4') further comprise:
- at least one second array (8, 8', 8a", 8b") of second lenses (9; 9a, 9b, 9c) which is arranged in a propagation direction (Z) of the light (3) between the at least one first array (6, 6', 6") and the area to be illuminated, wherein the second lenses (9; 9a, 9b, 9c) each have apertures and all have the same focal length ($f_9$);
- at least one third array (10, 10', 10") of third lenses (11; 11a, 11b, 11c) dividing the light (3) into the separate partial beams (5) at least with respect to a second direction (Y) perpendicular to the first direction (X), wherein the third lenses (11; 11a, 11b, 11c) all have the same focal length ($f_{11}$);
- at least one fourth array (12, 12', 12") of fourth lenses (13; 13a, 13b, 13c) which is arranged in the propagation direction (Z) of the light (3) between the at least one third array (10, 10', 10") and the at least one second array (8, 8', 8a", 8b") and the area to be illuminated, wherein the fourth lenses (13; 13a, 13b, 13c) all have the same focal length ($f_{13}$); and
- wherein the first lenses (7; 7a, 7b, 7c) and/or the second lenses (9; 9a, 9b, 9c) and/or the third lenses (11; 11a, 11b, 11c) and/or the fourth lenses (13; 13a, 13b, 13c) are arranged symmetrical with respect to the propagation direction (Z) of the light to be used for the illumination such that the first lenses (7; 7a, 7b, 7c) and/or the second lenses (9; 9a, 9b, 9c) and/or the third lenses (11; 11a, 11b, 11c) and/or the fourth lenses (13; 13a, 13b, 13c) do not alter the propagation direction (Z) of the light (3).

8. The device for illuminating an area according to claim 1, wherein the mask (14) is for a lithographic application.

9. The device according to claim 1, wherein the separation means comprise cylindrical lenses separated a predetermined distance from the mask.

10. A device for illuminating an area, comprising:
- at least one light source (1) for producing light (3) for an illumination;
- optics means (2) for shaping the light (3) produced by the at least one light source (1); and
- separation means (4, 4', 4") for dividing the light (3) to be used for the illumination into several mutually separated partial beams (5), the partial beams illuminating the area to be illuminated with a spacing therebetween,
- wherein the separation means (4, 4', 4") comprise at least one first array (6, 6', 6") of first lenses (7; 7a, 7b, 7c) dividing the light (3) into the separate partial beams (5) at least with respect to a first direction (X), wherein the first lenses (7; 7a, 7b, 7c) each have apertures and all have the same focal length ($f_7$),
- wherein the separation means (4, 4', 4") further comprise at least one second array (8, 8', 8a", 8b") of second lenses (9; 9a, 9b, 9c) which is arranged in a propagation direction (Z) of the light (3) between the at least one first array (6, 6', 6") and the area to be illuminated, wherein the second lenses (9; 9a, 9b, 9c) each have apertures and all have the same focal length ($f_9$), and
- wherein the distance between the at least one first array (6, 6', 6") and the at least one second array (8, 8', 8a", 8b") in the propagation direction (Z) of the light (3) corresponds to the sum of the focal length ($f_7$) of the first lenses (7; 7a, 7b, 7c) and the focal length ($f_9$) of the second lenses (9; 9a, 9b, 9c).

11. A device for illuminating an area, comprising:
- at least one light source (1) for producing light (3) for an illumination;
- optics means (2) for shaping the light (3) produced by the at least one light source (1); and
- separation means (4, 4', 4") for dividing the light (3) to be used for the illumination into several mutually separated partial beams (5), the partial beams illuminating the area to be illuminated with a spacing therebetween,
- wherein the separation means comprise at least one first array (6, 6', 6") of first lenses (7; 7a, 7b, 7c) dividing the light (3) into the separate partial beams (5) at least with respect to a first direction (X), wherein the first lenses (7; 7a, 7b, 7c) each have apertures and all have the same focal length ($f_7$), and
- wherein at least one of the apertures of the first lenses (7a, 7b, 7c) is different from the other apertures of the first lenses (7a, 7b, 7c).

12. A device for illuminating an area, comprising:
- at least one light source (1) for producing light (3) for an illumination;
- optics means (2) for shaping the light (3) produced by the at least one light source (1); and
- separation means (4, 4', 4") for dividing the light (3) to be used for the illumination into several mutually separated partial beams (5), the partial beams illuminating the area to be illuminated with a spacing therebetween,
- wherein the separation means comprise at least one first array (6, 6', 6") of first lenses (7; 7a, 7b, 7c) dividing the light (3) into the separate partial beams (5) at least with respect to a first direction (X), wherein the first lenses (7; 7a, 7b, 7c) each have apertures and all have the same focal length ($f_7$),
- wherein the separation means (4, 4', 4") further comprise at least one second array (8, 8', 8a", 8b") of second lenses (9; 9a, 9b, 9c) which is arranged in a propagation direction (Z) of the light (3) between the at least one first array (6, 6', 6") and the area to be illuminated, wherein the second lenses (9; 9a, 9b, 9c) each have apertures and all have the same focal length ($f_9$), and
- wherein at least one of the apertures of the second lenses (9a, 9b, 9c) is different from the other apertures of the second lenses (9a, 9b, 9c).

13. A device for illuminating an area, comprising:
- at least one light source (1) for producing light (3) for an illumination;

optics means (2) for shaping the light (3) produced by the at least one light source (1); and separation means (4, 4', 4") for dividing the light (3) to be used for the illumination into several mutually separated partial beams (5), the partial beams illuminating the area to be illuminated with a spacing therebetween, wherein the separation means comprise at least one first array (6, 6', 6") of first lenses (7; 7a, 7b, 7c) dividing the light (3) into the separate partial beams (5) at least with respect to a first direction (X), wherein the first lenses (7; 7a, 7b, 7c) each have apertures and all have the same focal length ($f_7$), wherein the separation means (4, 4', 4") further comprise at least one second array (8, 8', 8a", 8b") of second lenses (9; 9a, 9b, 9c) which is arranged in a propagation direction (Z) of the light (3) between the at least one first array (6, 6', 6") and the area to be illuminated, wherein the second lenses (9; 9a, 9b, 9c) each have apertures and all have the same focal length ($f_9$), and wherein the separation means (4, 4', 4") further comprise at least one third array (10, 10', 10") of third lenses (11; 11a, 11b, 11c) dividing the light (3) into the separate partial beams (5) at least with respect to a second direction (Y) perpendicular to the first direction (X), wherein the third lenses (11; 11a, 11b, 11c) all have the same focal length ($f_{11}$).

14. The device according to claim 13, wherein the third array (10, 10', 10") is arranged between the first array (6, 6', 6") and the second array (8, 8', 8a", 8b").

15. The device according to claim 13, wherein the separation means (4, 4', 4") further comprise at least one fourth array (12, 12', 12") of fourth lenses (13; 13a, 13b, 13c) which is arranged in the propagation direction (Z) of the light (3) between the at least one third array (10, 10', 10") and the at least one second array (8, 8', 8a", 8b") and the area to be illuminated, wherein the fourth lenses (13; 13a, 13b, 13c) all have the same focal length ($f_{13}$).

16. The device according to claim 11, wherein the distance between the at least one third array (10, 10', 10") and the at least one fourth array (12, 12', 12") in the propagation direction (Z) of the light (3) corresponds to the sum of the focal length ($f_{11}$) of the third lenses (11; 11a, 11b, 11c) and the focal length of the fourth lenses (13; 13a, 13b, 13c).

17. The device according to claim 15, wherein each of the fourth lenses (13) has an aperture and all apertures of the fourth lenses (14) are identical.

18. The device according to claim 15, wherein each of the fourth lenses (13) has an aperture and at least one of the apertures of the fourth lenses (13a, 13b, 13c) is different from other apertures of the fourth lenses (13a, 13b, 13c).

19. The device according to claim 13, wherein each of the third lenses (11) has an aperture and all apertures of the third lenses (11) are identical.

20. The device according to claim 13, wherein each of the third lenses (11) has an aperture and at least one of the apertures of the third lenses (11a, 11b, 11c) is different from other apertures of the third lenses (11a, 11b, 11c).

21. A device for illuminating an area, comprising:
at least one light source (1) for producing light (3) for an illumination;
optics means (2) for shaping the light (3) produced by the at least one light source (1); and
separation means (4, 4', 4") for dividing the light (3) to be used for the illumination into several mutually separated partial beams (5), the partial beams illuminating the area to be illuminated with a spacing therebetween, wherein the separation means comprise at least one first array (6, 6', 6") of first lenses (7; 7a, 7b, 7c) dividing the light (3) into separate partial beams (5) at least with respect to a first direction (X), wherein the first lenses (7; 7a, 7b, 7c) each have apertures and all have the same focal length ($f_7$), wherein the separation means (4, 4', 4") further comprise at least one second array (8, 8', 8a", 8b") of second lenses (9; 9a, 9b, 9c) which is arranged in a propagation direction (Z) of the light (3) between the at least one first array (6, 6', 6") and the area to be illuminated, wherein the second lenses (9; 9a, 9b, 9c) each have apertures and all have the same focal length ($f_9$), and wherein the separation means (4, 4', 4") further comprise at least one third array (10, 10', 10") of third lenses (11; 11a, 11b, 11c) dividing the light (3) into the separate partial beams (5) at least with respect to a second direction (Y) perpendicular to the first direction (X), wherein the third lenses (11; 11a, 11b, 11c) all have the same focal length ($f_{11}$), wherein the separation means (4, 4', 4") further comprise at least one fourth array (12, 12', 12") of fourth lenses (13; 13a, 13b, 13c) which is arranged in the propagation direction (Z) of the light (3) between the at least one third array (10, 10', 10") and the at least one second array (8, 8', 8a", 8b") and the area to be illuminated, wherein the fourth lenses (13; 13a, 13b, 13c) all have the same focal length ($f_{13}$), wherein the first lenses (7; 7a, 7b, 7c) and/or the second lenses (9; 9a, 9b, 9c) and/or the third lenses (11; 11a, 11b, 11c) and/or the fourth lenses (13; 13a, 13b, 13c) are formed as cylindrical lenses, and wherein cylinder axes of the first and the second lenses (7; 7a, 7b, 7c; 9; 9a, 9b, 9c) extend in the second direction (Y).

22. A device for illuminating an area, comprising:
at least one light source (1) for producing light (3) for an illumination;
optics means (2) for shaping the light (3) produced by the at least one light source (1); and
separation means (4, 4', 4") for dividing the light (3) to be used for the illumination into several mutually separated partial beams (5), the partial beams illuminating the area to be illuminated with a spacing therebetween, wherein the separation means comprise at least one first array (6, 6', 6") of first lenses (7; 7a, 7b, 7c) dividing the light (3) into the separate partial beams (5) at least with respect to a first direction (X), wherein the first lenses (7; 7a, 7b, 7c) each have apertures and all have the same focal length ($f_7$), wherein the separation means (4, 4', 4") further comprise at least one second array (8, 8', 8a", 8b") of second lenses (9; 9a, 9b, 9c) which is arranged in a propagation direction (Z) of the light (3) between the at least one first array (6, 6', 6") and the area to be illuminated, wherein the second lenses (9; 9a, 9b, 9c) each have apertures and all have the same focal length ($f_9$), and wherein the separation means (4, 4', 4") further comprise at least one third array (10, 10', 10") of third lenses (11; 11a, 11b, 11c) dividing the light (3) into the separate partial beams (5) at least with respect to a second direction (Y) perpendicular to the first direction (X), wherein the third lenses (11; 11a, 11b, 11c) all have the same focal length ($f_{11}$), wherein the separation means (4, 4', 4") further comprise at least one fourth array (12, 12', 12") of fourth lenses (13; 13a, 13b, 13c) which is arranged in the propagation direction (Z) of the light (3) between the at least one third array (10, 10', 10") and the at least one second array (8, 8', 8a", 8b") and the area to be illuminated, wherein the fourth lenses (13; 13a, 13b, 13c) all have the same focal length ($f_{13}$), wherein the first lenses (7; 7a, 7b, 7c) and/or the second lenses (9; 9a, 9b, 9c) and/or the third lenses (11; 11a, 11b, 11c) and/or the fourth lenses (13; 13a, 13b, 13c) are formed as cylindrical lenses, and wherein cylinder axes of the third and the fourth lenses (11; 11a, 11b, 11c; 13; 13a, 13b, 13c) extend in the first direction (X).

23. A device for illuminating an area, comprising:

at least one light source (1) for producing light (3) for an illumination;

optics means (2) for shaping the light (3) produced by the at least one light source (1); and separation means (4, 4', 4") for dividing the light (3) to be used for the illumination into several mutually separated partial beams (5), the partial beams illuminating the area to be illuminated with a spacing therebetween, wherein the separation means comprise at least one first array (6, 6', 6") of first lenses (7; 7a, 7b, 7c) dividing the light (3) into separate partial beams (5) at least with respect to a first direction (X), wherein the first lenses (7; 7a, 7b, 7c) each have apertures and all have the same focal length ($f_7$), wherein the separation means (4, 4', 4") further comprise at least one second array (8, 8', 8a", 8b") of second lenses (9; 9a, 9b, 9c) which is arranged in a propagation direction (Z) of the light (3) between the at least one first array (6, 6', 6") and the area to be illuminated, wherein the second lenses (9; 9a, 9b, 9c) each have apertures and all have the same focal length ($f_9$), and wherein the separation means (4, 4', 4") further comprise at least one third array (10, 10', 10") of third lenses (11; 11a, 11b, 11c) dividing the light (3) into the separate partial beams (5) at least with respect to a second direction (Y) perpendicular to the first direction (X), wherein the third lenses (11; 11a, 11b, 11c) all have the same focal length ($f_{11}$), wherein the separation means (4, 4', 4") further comprise at least one fourth array (12, 12', 12") of fourth lenses (13; 13a, 13b, 13c) which is arranged in the propagation direction (Z) of the light (3) between the at least one third array (10, 10', 10") and the at least one second array (8, 8', 8a", 8b") and the area to be illuminated, wherein the fourth lenses (13; 13a, 13b, 13c) all have the same focal length ($f_{13}$), wherein the first lenses (7; 7a, 7b, 7c) and/or the second lenses (9; 9a, 9b, 9c) and/or the third lenses (11; 11a, 11b, 11c) and/or the fourth lenses (13; 13a, 13b, 13c) are formed as cylindrical lenses, wherein the first lenses (7; 7a, 7b, 7c) and/or the second lenses (9; 9a, 9b, 9c) and/or the third lenses (11; 11a, 11b, 11c) and/or the fourth lenses (13; 13a, 13b, 13c) are arranged asymmetrical with respect to the propagation direction (Z) of the light (3) such that the first lenses (7; 7a, 7b, 7c) and/or the second lenses (9; 9a, 9b, 9c) and/or the third lenses (11; 11a, 11b, 11c) and/or the fourth lenses (13; 13a, 13b, 13c) alter the propagation direction (Z) of the light (3).

24. A device for applying light to a work area, comprising:

at least one light source (1) for producing light (3) for applying the light to the work area;

optics means (2) for shaping the light (3) produced by the at least one light source (1);

a mask (14) having a plurality of openings (15) or transparent regions for passing the light (3) in a direction towards the work area, and opaque regions (16) disposed between the openings (15) or transparent regions; and separation means (4, 4') dividing the light (3) to be applied into several mutually separate partial beams (5) so that the separate partial beams (5) illuminate the mask (14) with a spacing therebetween, wherein at least one of the transparent regions or openings is fully illuminated, whereas the opaque regions (16) of the mask (14) arranged between the openings (15) or between the transparent regions are at least partially not illuminated.

25. The device according to claim 24, wherein the work area is a lithograph application.

26. The device according to claim 24, wherein every transparent region or opening is illuminated.

27. The device according to claim 24, wherein the separation means comprise cylindrical lenses separated a predetermined distance from the mask.

* * * * *